Figure 1:
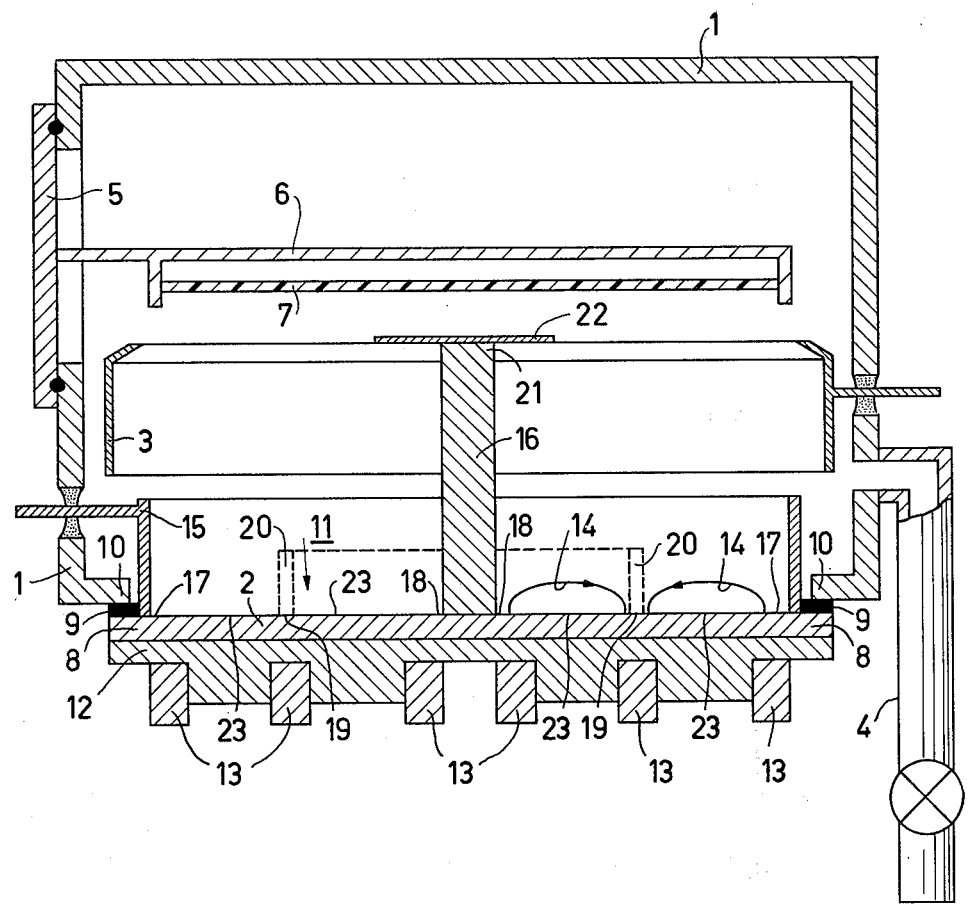

United States Patent [19]

Crombeen et al.

[11] 4,427,524

[45] Jan. 24, 1984

[54] MAGNETRON CATHODE SPUTTERING SYSTEM

[75] Inventors: Jacobus E. Crombeen; Jan Visser; Gary E. Thomas, all of Eindhoven, Netherlands

[73] Assignee: U.S. Philips Corporation, New York, N.Y.

[21] Appl. No.: 492,107

[22] Filed: May 6, 1983

[30] Foreign Application Priority Data

May 21, 1982 [NL] Netherlands ............... 8202092

[51] Int. Cl.³ .................................. C23C 15/00
[52] U.S. Cl. ........................... 204/298; 204/192 R
[58] Field of Search ................................ 204/298

[56] References Cited

U.S. PATENT DOCUMENTS 4,362,611 12/1982 Logan et al. .............. 204/298

Primary Examiner—Arthur P. Demers
Attorney, Agent, or Firm—Robert J. Kraus

[57] ABSTRACT

Such a system comprises in an envelope 1 a flat cathode 2 from the material to be sputtered and a substantially circular anode situated coaxially with respect to said cathode. Behind the cathode, magnetic means 13 are provided to generate at least one closed tunnel of field lines 14 over a part of the cathode surface (a so-called electron trap). Between the anode 3 and the edge 8 of the cathode is present according to the invention a coaxial, substantially cylindrical auxiliary electrode 15. From the center of the cathode a rod-shaped auxiliary electrode 16 moreover extends axially. Said auxiliary electrodes 15 and 16 modify the electric field in such a manner that the electrons which are not captured in the tunnel of magnetic field lines are directed substantially towards the anode 3. The distance from the rod-shaped electrode 16 to the substrate 7 must be chosen to be comparatively small. By using the invention the substrate is less heated and not so much damaged by electron bombardment.

5 Claims, 2 Drawing Figures

MAGNETRON CATHODE SPUTTERING SYSTEM

The invention relates to a magnetron cathode sputtering system comprising an envelope, a flat cathode plate consisting at least in a surface layer of material to be sputtered, a substantially ring-shaped anode which is coaxial with the cathode plate, magnetic means disposed on the side of the cathode plate which is remote from the anode and generates at least one closed tunnel of magnetic field lines over a part of the cathode surface, the tunnel forming at least one electron trap.

Such a magnetron cathode sputtering system is frequently used for providing thin films of a material (for example, a metal) on a substrate. During operation of the system the substrate to be coated is placed in the envelope which is filled with a gas. By applying a sufficiently high potential between the anode and the cathode, a gas discharge is formed in which gas ions impact on the cathode at high velocity and release material therefrom (mainly atoms). This sputtered material is collected by the substrate. By providing one or more tunnels of magnetic field lines in front of the cathode which capture electrons emitted by the cathode, more ions are formed and hence the sputtering process is intensified. As a result of this the desired coating is more rapidly formed on the substrate. The flat cathode may be, for example, square, rectangular or disc-shaped. The substantially ring shaped anode is adapted to the shape of the cathode. Such a magnetron cathode sputtering system is known from "Vacuum", vol. 28, No. 4, 1978. This article describes a modified magnetron cathode sputtering system. In this system a metal rod extends from the centre of a disc-shaped cathode and forms an elongated pole shoe of a magnetic system. The other pole shoe of said system surrounds and is coaxial with the disc-shaped cathode. The magnetic field between said poleshoes forms the so-called electron trap. The diameter of the disc-shaped cathode used in said system was less than 100 mm.

Such magnetron cathode sputtering systems are used inter alia in the manufacture of semiconductors and for the manufacture of optical record carriers in which a substrate consisting of a thin synthetic plastics or glass disc in which the information is present in the form of a large number of pits is coated with a thin reflecting metal film. Such record carriers are used in the video longplay system, VLP system (Trade Mark), of N. V. Philips' Gloeilampenfabrieken described inter alia in Philips Tech. Rev. 33, 178–180, 1973, No. 7. Such a disc has a diameter of approximately 30 cm and must be covered very uniformly. The disc should not be heated significantly or be exposed to significant electron bombardment, since this may damage the disc. Heating and damage by electrons is not desired either in the manufacture of semiconductors with such a system.

It is therefore an object of the invention to provide a magnetron cathode sputtering system in which fewer electrons impinge on the substrate to be covered than in the systems used so far as a result of which damage of the substrate is reduced or prevented.

For that purpose, a magnetron cathode sputtering system of the type mentioned in the opening paragraph is characterized according to the invention in that the electron trap surrounds and is spaced from a rod-shaped electrode extending axially from the centre of the cathode plate, an auxiliary electrode having a tubular cross-section which is coaxial with the cathode plate and extends from near the periphery of the cathode plate, wherein both the rod-shaped electrode and the auxiliary electrode extend from areas on the surface of the cathode plate where no electron trap is present, wherein the bores of the auxiliary electrode and at least of the end portion of the anode which is nearer the cathode plate, the periphery of the cathode plate and the periphery of the rod-shaped electrode are mutually parallel, and wherein during operation of the system the rod-shaped electrode is so spaced from the substrate on which material is to be sputtered that electrons tend to be directed towards the anode.

The cathode plate can be circular, square or regularly polygonal.

When two or more electron traps are used, coaxial cylindrical auxiliary electrodes extending from the cathode surface may also be provided between said electron traps. The electric field between the cathode and the anode is thus influenced so that more electrons move towards the anode and do not impinge on the substrate. The auxiliary electrodes modify the electric field for the cathode in such a manner that the electrons which are not captured by the electron traps are moved in paths terminating on the anode instead of on the substrate. During the sputtering process the auxiliary electrodes may have the same potential as the cathode. Because the sputtering of the cathode takes place only from the cathode surface below the electron traps it is not necessary to manufacture the auxiliary electrodes from the material to be sputtered.

If one or more auxiliary electrodes are accommodated so as to be electrically insulated with respect to the cathode, it is possible to vary the potential at the electrodes so that even more electrons are conducted away from the substrate towards the anode.

In the above-mentioned VLP system record carriers the central part of the substrate may remain uncovered so that it is possible to provide the rod-shaped auxiliary electrode at its end with a radially extending flange or disc. As a result of this the electric field is modified even more favourably.

Figure 2:
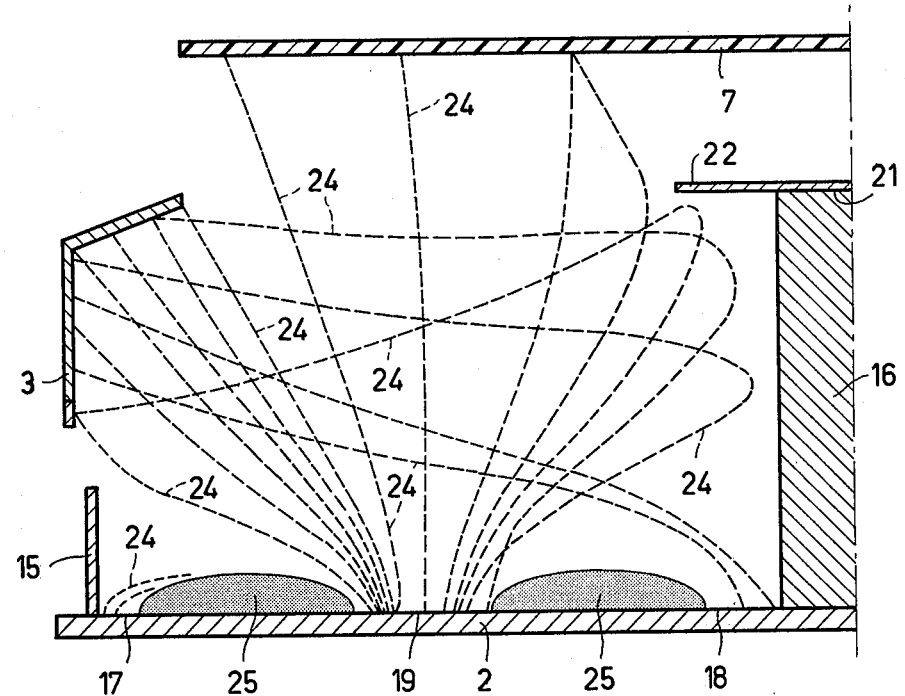

An embodiment of the invention will now be described by way of example, with reference to the drawings, in which FIG. 1 is a diagrammatic sectional view of a magnetron cathode sputtering system according to the invention and FIG. 2 shows a number of electron paths in part of such a system.

The magnetron cathode sputtering system shown in FIG. 1 comprises an envelope 1, a disc-shaped cathode 2 and a substantially cylindrical anode 3 which is coaxial with the cathode 2. The envelope 1 can be evacuated and be filled with a gas (for example with argon) via an exhaust tube 4. The envelope 1 furthermore comprises a door 5 to which a holder 6 for a substrate 7 to be sputtered is connected. In this case the substrate 7 is a synthetic plastics disc-shaped record carrier for a VLP-system. The cathode 2 consists of a 1 cm thick plate of the material to be sputtered, for example aluminium. The peripheral ring 8 of a major surface of cathode 2 is connected to an annular flange 10 surrounding an aperture 11 in envelope 1 by means of a gasket 9 of an electrically insulating material. A cathode supporting plate 12 abuts the major surface of the cathode 2 which is remote from the anode 3, and a number of magnets 13 are secured to the back of the cathode supporting plate 12 and generate for the surface of cathode 2 closed circumferential tunnels of magnetic field lines 14. The electrons originating from the cathode 2 are trapped in said tunnels and then ionize the gas in the envelope 1 close to the cathode surface. By trapping a part of the electrons emitted by the cathode 2 in the electron traps, more ions are formed than without the use of said electron traps and the sputtering process is intensified. Because a part of the electrons emitted by the cathode are not captured and partly impinge on the substrate 7, measures have to be taken to prevent heating and damage of said substrate 7. Therefore according to the invention, a coaxial, substantially cylindrical auxiliary electrode 15 is provided between the anode and the cathode 2 near the edge 8 of the cathode 2 and a rod-shaped auxiliary electrode 16 is provided in the centre of the cathode. Both the cylindrical auxiliary electrode 15 and the rod-shaped auxiliary electrode 16 are provided near parts 17 and 18 of the cathode where no electron traps are present. As will be explained with reference to FIG. 2, the distance from the rod-shaped auxiliary electrode to the substrate 7 to be sputtered is chosen so that both the electrons emitted from the parts 17 and 18 and also the electrons emitted from the part 19 of the cathode present between the electron traps are directed as far as possible towards the anode 3.

When more than one electron trap is used it is possible to provide cylindrical auxiliary electrodes between the electron traps (in FIG. 1 part 19 of the cathode surface). As an example, a cylindrical auxiliary electrode 20 is shown in FIG. 1 in broken lines.

It is possible to arrange one or more of the cylindrical auxiliary electrodes 15 and 20 and the rod-shaped auxiliary electrode 16 in an electrically insulated manner with respect to the cathode 2 and to vary the potential at said electrodes so that even more electrons are directed towards the anode 3 instead of towards the substrate 7. By providing the rod-shaped auxiliary electrode 16 at its end 21 with a radially extending disc 22, the electric field can be modified even more favourably.

With a diameter of the substrate 7 of approximately 30 cm, the distance from the disc 22 to the substrate 7 is preferably approximately 2 to 3 cm. The rod-shaped electrode 16 in this case has a length of approximately 10 cm and a diameter of approximately 3 cm.

The erosion of a cathode of a magnetron cathode sputtering system is not the same throughout the surface but is concentrated in the centre 23 of the electron trap where a crater is formed after a number of hours in operation. The mechanical forces must therefore be received by the cathode supporting plate 12 which hence has to be thick. The cathode supporting plate 12 at the area of the magnets 13, however, is chosen to be comparatively thin so as to reduce the magnetic field strength inside the envelope 1 as little as possible. This stronger magnetic field at the cathode surface also results in a better electron yield of the electron traps so that fewer electrons land on the substrate 7.

FIG. 2 shows one half of a detail of the sectional view of FIG. 1 having therein a number of electrons paths 24 (broken lines) of electrons originating from the parts 17, 18 and 19 of the cathode surface. Two circular areas 25 (only the cross-section is visible) consisting of a quantity of ionized gas are present in front of the cathode 2 and are the result of providing the two electron traps. By providing the cylindrical auxiliary electrode 15 and the rod-shaped auxiliary electrode 16, the number of electrons incident on the substrate 7 can be drastically reduced as a result of which the substrate 7 is not damaged due to heating and electron bombardment. The cylindrical auxiliary electrodes 15 and 20 and the rod-shaped auxiliary electrode 16 are present near the respective parts 17, 19 and 18 of the cathode where no electron traps are present but where the magnetic field lines leave the cathode surface.

The invention is not restricted to magnetron cathode sputtering systems having circular cathodes and annular anodes but may, of course, also be used in systems having rectangular or square cathodes. Consequently, the circular anodes used in that latter case have a rectangular or square shape. In such systems the cylindrical auxiliary electrodes and rod-shaped auxiliary electrode have a rectangular of square cross-section. The distance from the rod-shaped auxiliary electrode 16 to the substrate may also be chosen to be larger than in the embodiment described. However, the operation thereof then becomes less effective.

What is claimed is:

1. A magnetron cathode sputtering system comprising an envelope, a flat cathode plate consisting at least in a surface layer of material to be sputtered, a substantially ring shaped anode which is coaxial with the cathode plate, magnetic means disposed on the side of the cathode plate which is remote from the anode and generates at least one closed tunnel of magnetic field lines over a part of the cathode surface, the tunnel forming at least one electron trap, characterized in, that the electron trap surrounds and is spaced from a rod-shaped electrode extending axially from the centre of the cathode plate, an auxiliary electrode having a tubular cross-section which is coaxial with the cathode plate and extends from near the periphery of the cathode plate, wherein both the rod-shaped electrode and the auxiliary electrode extend from areas on the surface of the cathode plate where no electron trap is present, wherein the bores of the auxiliary electrode and at least of the end portion of the anode which is nearer the cathode plate, the periphery of the cathode plate and the periphery of the rod-shaped electrode are mutually parallel, and wherein during operation of the system the rod-shaped electrode is so spaced from the substrate on which material is to be sputtered that electrons tend to be directed towards the anode.

2. A magnetron cathode sputtering system as claimed in claim 1, wherein the cathode plate is circular, square or regularly polygonal.

3. A magnetron cathode sputtering system as claimed in claim 1, characterized in that at least two electron traps for the cathode surface are present and coaxial, auxiliary electrodes having tubular cross-sections extend from the cathode surface between the electron traps.

4. A magnetron cathode sputtering system as claimed in claim 1, characterized in that at least one of the auxiliary electrodes is arranged so as to be electrically insulated with respect to the cathode.

5. A magnetron cathode sputtering system as claimed in claim 1, characterized in that the rod-shaped auxiliary electrode is provided at its end with a radially extending flange or disc.

* * * * *